(12) United States Patent
Wang et al.

(10) Patent No.: US 9,748,392 B1
(45) Date of Patent: Aug. 29, 2017

(54) FORMATION OF WORK-FUNCTION LAYERS FOR GATE ELECTRODE USING A GAS CLUSTER ION BEAM

(71) Applicant: GLOBALFOUNDRIES Inc., Grand Cayman (KY)

(72) Inventors: Yanzhen Wang, Clifton Park, NY (US); Jidong Huang, Rexford, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/053,867

(22) Filed: Feb. 25, 2016

(51) Int. Cl.
| | | |
|---|---|---|
| *H01L 21/283* | (2006.01) | |
| *H01L 29/78* | (2006.01) | |
| *H01L 29/66* | (2006.01) | |
| *H01L 29/06* | (2006.01) | |
| *H01L 21/285* | (2006.01) | |
| *H01L 21/28* | (2006.01) | |
| *H01L 29/49* | (2006.01) | |

(52) U.S. Cl.
CPC .... *H01L 29/7851* (2013.01); *H01L 21/28008* (2013.01); *H01L 21/2855* (2013.01); *H01L 29/0649* (2013.01); *H01L 29/495* (2013.01); *H01L 29/4966* (2013.01); *H01L 29/66795* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/7831
USPC ........ 257/288, 328, 368, 369; 438/137, 138, 438/151, 156, 173, 197, 199
See application file for complete search history.

(56) References Cited

U.S. PATENT DOCUMENTS

| | | | |
|---|---|---|---|
| 8,088,685 B2 | 1/2012 | Lin et al. | |
| 2009/0047768 A1* | 2/2009 | Jain | H01L 21/2251 438/306 |
| 2011/0163393 A1* | 7/2011 | Lander | H01L 29/785 257/401 |
| 2011/0212592 A1* | 9/2011 | Nieh | H01L 21/26506 438/306 |
| 2016/0240650 A1* | 8/2016 | Chang | H01L 29/785 |

OTHER PUBLICATIONS

Inoue, et al., "Incident Angle Dependence on O2 Cluster Ions on Ta2O5 Thin Film Properties," Jpn. J. Appl. Phys. 43 (2004) pp. 3951-3954.

* cited by examiner

*Primary Examiner* — Jarrett Stark
*Assistant Examiner* — Shahed Ahmed
(74) *Attorney, Agent, or Firm* — Wayne F. Reinke, Esq.; Heslin Rothenberg Farley & Mesiti P.C.

(57) ABSTRACT

An angled gas cluster ion beam is used for each sidewall and top of a fin (two applications) to form work-function metal layer(s) only on the sidewalls and top of each fin.

5 Claims, 4 Drawing Sheets

FORMATION OF WORK-FUNCTION LAYERS FOR GATE ELECTRODE USING A GAS CLUSTER ION BEAM

BACKGROUND OF THE INVENTION

Technical Field

The present invention generally relates to fabricating FinFETs. More particularly, the present invention relates to selective formation of work-function metal for the gate of a FinFET.

Background Information

As transistor size continues to shrink, so does the space available for the gate stack, which can lead to pinch-off. Previously, chamfering of the work-function layers in the gate stack was used to combat pinch-off. However, the industry has reached sizes where chamfering is no longer viable.

Thus, a need exists for a downwardly scalable way to form gate stack work-function layers reducing or eliminating pinch-off.

SUMMARY OF THE INVENTION

The shortcomings of the prior art are overcome and additional advantages are provided through the provision, in one aspect, of a method of work-function material deposition. The method includes providing a starting semiconductor structure, the starting semiconductor structure including a semiconductor substrate, at least one fin couples to the substrate, a bottom portion thereof surrounded by isolation material, and spacers for at least one gate surrounding a top portion of the at least one fin. The method further includes selectively forming work-function metal only on sidewalls and a top of the at least one fin, such that no work-function metal is formed on the spacers.

In accordance with another aspect, a semiconductor structure is provided. The semiconductor structure includes a semiconductor substrate, at least one fin coupled to the substrate, and work-function metal only on two opposite sidewalls and a top surface of the at least one fin.

These, and other objects, features and advantages of this invention will become apparent from the following detailed description of the various aspects of the invention taken in conjunction with the accompanying drawings.

Figure 4:
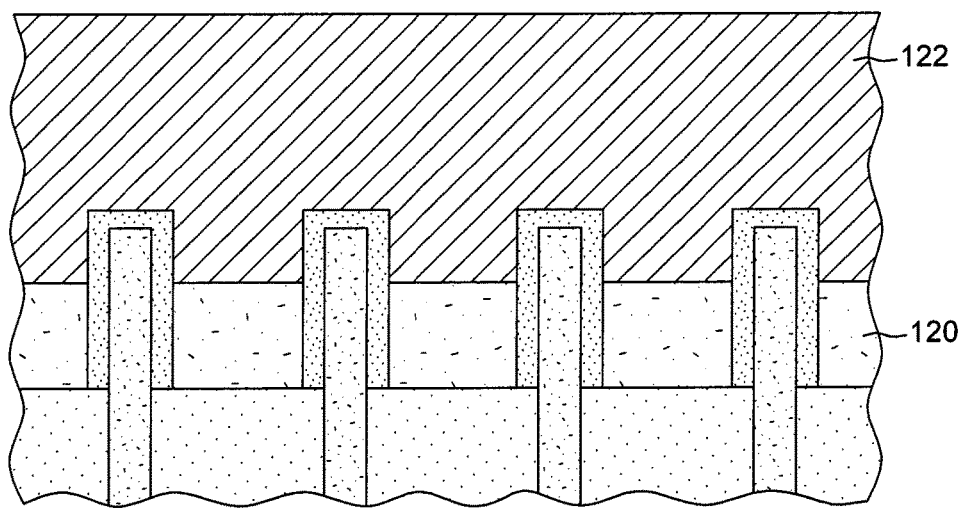
FIG. 4 depicts one example of the structure of FIG. 3 after formation of a dielectric layer (e.g., flowable oxide or low-k dielectric) around the fin(s) and filling of the remaining space with a gate metal (e.g., tungsten), in accordance with one or more aspects of the present invention.
Figure 5:
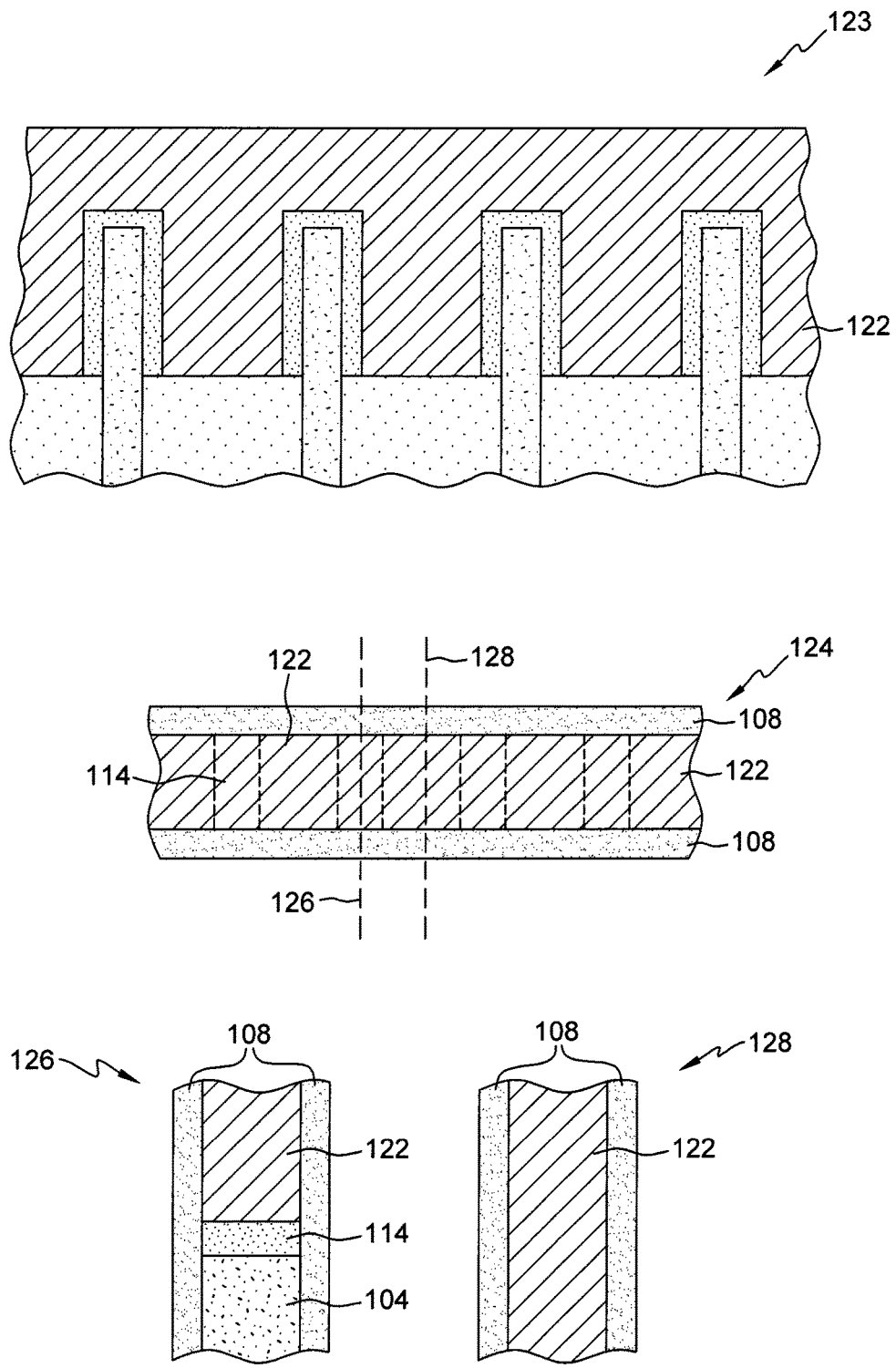

Shown in FIG. 5 is a cross-sectional view of the structure of FIG. 4 prior to formation of the metal, is a top-down view of the main cross-sectional view, and with two cross-sectional views taken across two vertical lines.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

Figure 1:
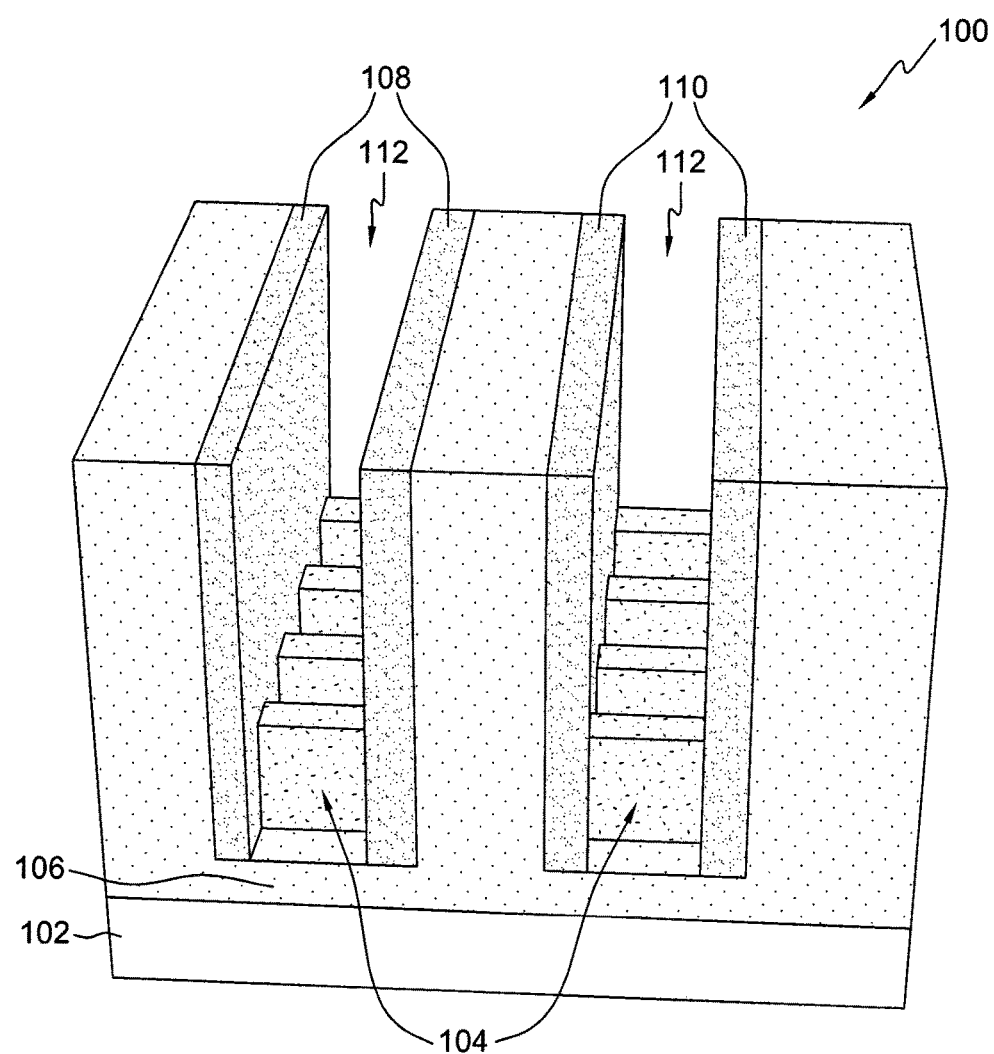
FIG. 1 is a three-dimensional elevation view of one example of a starting semiconductor structure, the starting semiconductor structure including a semiconductor substrate with one or more fins (four fins in the present example) surrounded at a bottom portion thereof by isolation material and surrounded at a top portion thereof by spacer pairs, with an empty space between each spacer pair, in accordance with one or more aspects of the present invention.

FIG. 1 is a three-dimensional elevation view of one example of a starting semiconductor structure 100, the starting semiconductor structure including a semiconductor substrate 102 with one or more fins 104 (four fins in the present example) surrounded at a bottom portion thereof by isolation material 106 and surrounded at a top portion thereof by spacer pairs 108 and 110, with empty space 112 between each spacer pair, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The fin(s) coupled to the substrate may, for example, be etched from a bulk substrate, and may include, for example, any of the materials listed above with respect to the substrate. Further, some or all of the fin(s) may include added impurities (e.g., by doping), making them n-type or p-type.

Figure 2:
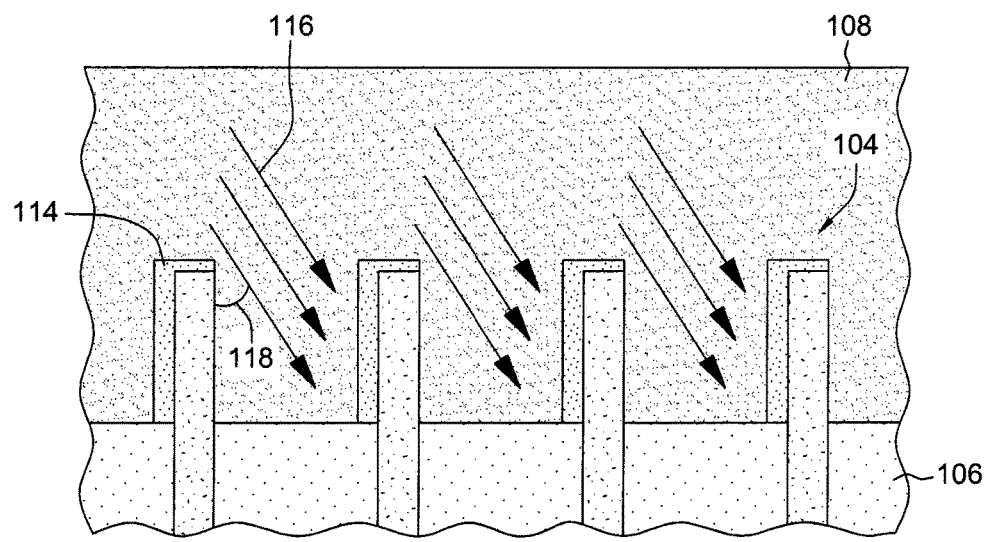
FIG. 2 is a cross-sectional view taken through the spacer(s) of one example of the structure of FIG. 1 during formation of a work-function metal on a first side and top surface of the fin(s) using a Gas Cluster Ion Beam (GCIB) at an angle with respect to a second (opposite) side of the fin(s), in accordance with one or more aspects of the present invention.

FIG. 2 is a cross-sectional view taken through the spacer(s) of one example of the structure of FIG. 1 during formation of a work-function metal 114 on a first side and top surface of the fin(s) using a Gas Cluster Ion Beam (GCIB) 116 at an angle 118 with respect to a second (opposite) side of the fin(s), in accordance with one or more aspects of the present invention.

Figure 3:
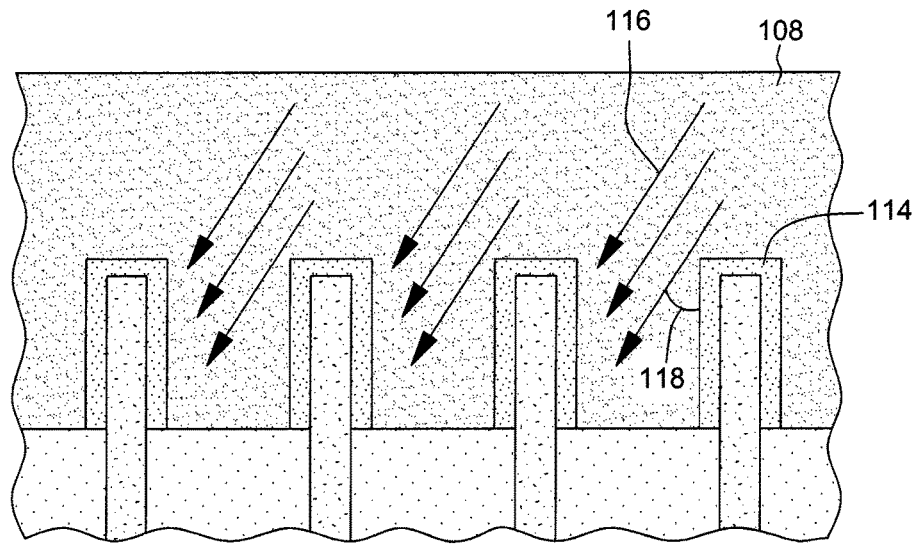
FIG. 3 depicts one example of the structure of FIG. 2 during formation by GCIB of the work-function metal on the second (opposite) side and top surface of the fin(s), the ion beam at the same angle with respect to the first side of the fin(s), in accordance with one or more aspects of the present invention.

FIG. 3 depicts one example of the structure of FIG. 2 during formation by GCIB 116 of the work-function metal 114 on the second (opposite) side and top surface of the fin(s) 104, the ion beam at the same angle 118 with respect to the first side of the fin(s), in accordance with one or more aspects of the present invention. As the work-function metal deposition is in one direction, therefore, the work-function metal is only around each fin; there is no work-function metal on the spacer. This leads to more space for a low resistance metal, such as tungsten. The work-function metal may include, in a non-limiting example, any of tungsten, titanium nitride, tantalum nitride, aluminum, titanium copper aluminum, etc., or combinations thereof.

FIG. 4 depicts one example of the structure of FIG. 3 after formation of a dielectric layer 120 (e.g., flowable oxide or low-k dielectric) around the fin(s) and filling of the remaining space with a gate metal 122, in accordance with one or more aspects of the present invention.

Shown in FIG. 5 is a cross-sectional view of an alternate structure 123, a top-down view 124 of the main cross-sectional view, and includes two cross-sectional views taken across lines 126 and 128, in accordance with one or more aspects of the present invention. In FIG. 5, metal 122 (e.g., tungsten) has already been formed after GCIB.

In a first aspect, disclosed above is a method. The method includes providing a starting semiconductor structure, the starting semiconductor structure including a semiconductor substrate, fin(s) coupled to the substrate, a bottom portion thereof surrounded by isolation material, and spacers for gate(s) surrounding a top portion of the fin(s). The method further includes selectively forming work-function metal only on sidewalls and a top of the fin(s).

In one example, selectively forming the work-function metal includes, for example, forming work-function metal only on a first sidewall and a top surface of the fin(s), and forming the work-function metal only on a second sidewall opposite the first sidewall and top surface of the fin(s).

In one example, forming the work-function metal only on the first sidewall and the top surface may include, for example, using a gas cluster ion beam (GCIB) process, an ion beam of the GCIB process being angled with respect to a second sidewall opposite the first sidewall of the fin(s). In one example, forming the work-function metal only on the second sidewall and top surface may include, for example, using the GCIB process again, an ion beam of the GCIB process being angled with respect to the first sidewall of the at least one fin. In one example, the angle may be, for example, determined according to: Tan X=(Fin Pitch minus Fin Width) divided by a Fin Height, where X is the angle.

In a second aspect, disclosed above is a semiconductor structure. The semiconductor structure includes a semiconductor substrate, fin(s) coupled to the substrate, and work-function metal only on two opposite sidewalls and a top surface of the fin(s).

In one example, the semiconductor structure may further include, for example, a bottom portion of the fin(s) with the work-function metal surrounded by a dielectric layer, and a gate electrode surrounding a top portion of the fin(s) with the work-function metal.

In one example, the work-function metal of the semiconductor structure of the second aspect may include, for example, one or more of tungsten, titanium nitride, tantalum nitride, aluminum, titanium copper aluminum, etc., or combinations thereof.

In one example, a top-down view of the semiconductor structure of the second aspect shows only the work-function metal over the fin(s) between gate spacers. In one example, a cross-sectional view of the structure taken through a fin shows a layer of work-function metal between the fin(s) below and the gate electrode above. In one example, a cross-sectional view of the structure taken between work-function metal layers shows only the gate electrode between the gate spacers.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting semiconductor structure, the starting semiconductor structure comprising a semiconductor substrate, at least one fin coupled to the substrate, a bottom portion thereof surrounded by isolation material, and spacers for at least one gate surrounding a top portion of the at least one fin; and
selectively forming work-function metal only on sidewalls and a top of the at least one fin, such that no work-function metal is formed on the spacers.

2. The method of claim 1, wherein the selectively forming comprises:
forming work-function metal only on a first sidewall and a top surface of the at least one fin; and
forming the work-function metal only on a second sidewall opposite the first sidewall and a top surface of the at least one fin.

3. The method of claim 2, wherein forming the work-function metal only on the first sidewall and the top surface comprises using a gas cluster ion beam (GCIB) process, wherein an ion beam of the GCIB process is angled with respect to a second sidewall opposite the first sidewall of the at least one fin.

4. The method of claim 3, wherein forming the work-function metal only on the second sidewall and top surface comprises using the GCIB process again, wherein an ion beam of the GCIB process is angled with respect to the first sidewall of the at least one fin.

5. The method of claim 3, wherein the angle can be determined according to:
Tan X=(Fin Pitch minus Fin Width) divided by a Fin Height, wherein X is the angle.

* * * * *